(12) United States Patent
Skeoch

(10) Patent No.: US 6,747,862 B1
(45) Date of Patent: Jun. 8, 2004

(54) SYSTEM AND METHOD FOR PROVIDING HIGH VOLTAGE WITHSTAND CAPABILITY BETWEEN PINS OF A HIGH-DENSITY COMPLIANT PIN CONNECTOR

(75) Inventor: Steven Skeoch, Petaluma, CA (US)

(73) Assignee: Alcatel, Paris (FR)

( * ) Notice: Subject to any disclaimer, the term of this patent is extended or adjusted under 35 U.S.C. 154(b) by 514 days.

(21) Appl. No.: 09/618,080

(22) Filed: Jul. 17, 2000

(51) Int. Cl.[7] .............................. H05K 1/14; H05K 3/36
(52) U.S. Cl. ........................ 361/119; 361/792; 29/830
(58) Field of Search .............................. 361/119, 785, 361/775, 792; 439/637, 943; 29/830, 852, 846; 174/266, 72 B, 71 B, 88 B, 262

(56) References Cited

U.S. PATENT DOCUMENTS

| | | | | |
|---|---|---|---|---|
| 4,258,468 A | * | 3/1981 | Balde .......................... | 29/830 |
| 4,263,341 A | * | 4/1981 | Martyniak ................... | 427/97 |
| 4,323,593 A | * | 4/1982 | Tsunashima ................ | 427/97 |
| 4,787,853 A | * | 11/1988 | Igarrashi ..................... | 439/55 |
| 5,450,290 A | * | 9/1995 | Boyko et al. ............... | 361/792 |
| 5,557,844 A | * | 9/1996 | Bhatt et al. ................. | 29/852 |
| 5,814,889 A | * | 9/1998 | Gaul ............................ | 257/773 |
| 5,908,333 A | * | 6/1999 | Perino et al. ............... | 439/631 |
| 6,079,100 A | * | 6/2000 | Farquhar et al. ........... | 29/852 |
| 6,312,296 B1 | * | 11/2001 | Jones .......................... | 439/751 |

* cited by examiner

Primary Examiner—Rajnikant B. Patel
(74) Attorney, Agent, or Firm—Danamraj & Youst, P.C.; Richard A. Mysliwiec; V. Lawrence Sewell

(57) ABSTRACT

A system and method for providing high voltage resistance capability in a receptacle apparatus for accepting a high-density compliant pin connector. A plurality of high-density compliant pin through-holes are formed in a printed circuit board for receiving the pins of the high-density compliant pin connector. The through-holes are plated using an electrically conductive material, whereby conductive pads are formed around the plated through-holes on at least one side of the printed circuit board. Thereafter, the conductive pads around the plated through-holes on the printed circuit board are removed by controlled depth back-drilling so as to increase the inter-pad clearance of the through-holes for withstanding foreign voltages.

21 Claims, 3 Drawing Sheets

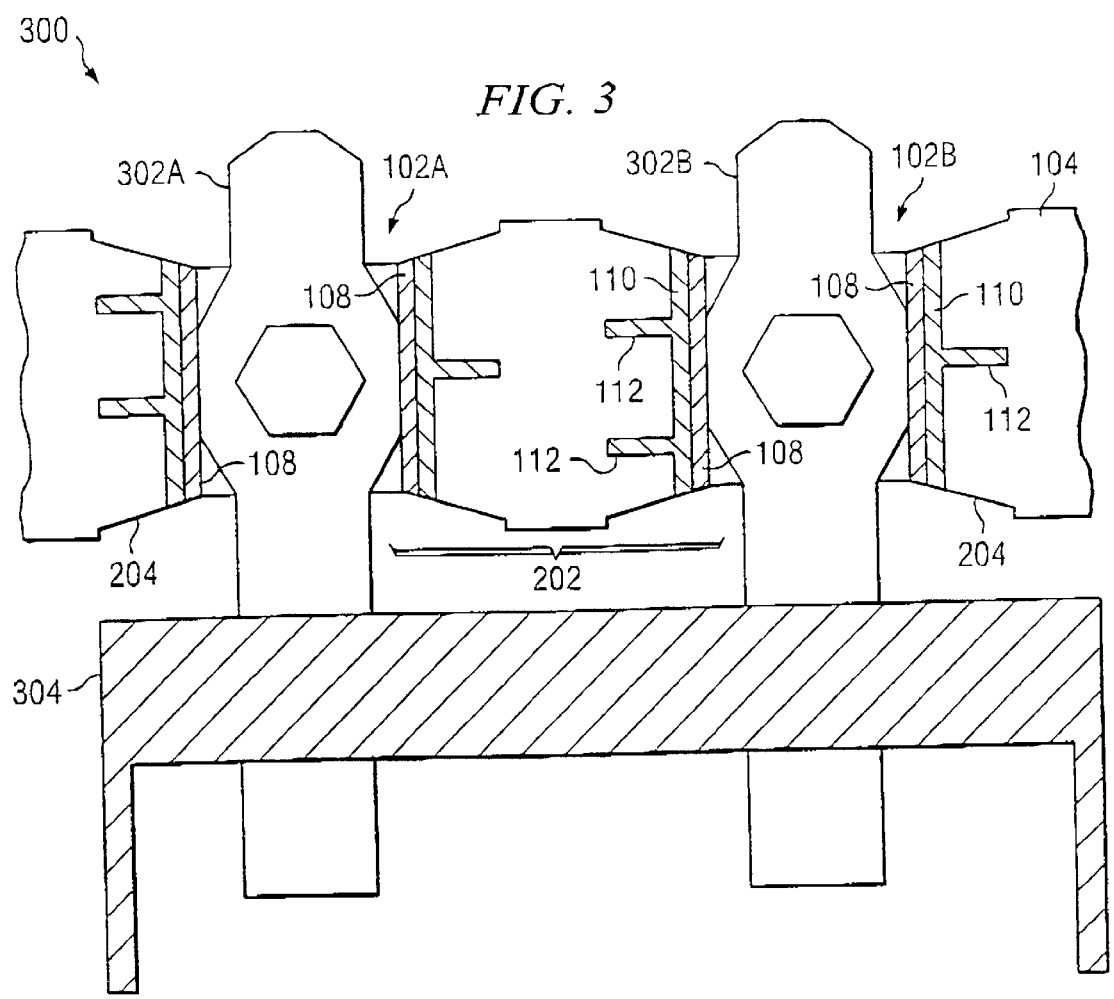

SYSTEM AND METHOD FOR PROVIDING HIGH VOLTAGE WITHSTAND CAPABILITY BETWEEN PINS OF A HIGH-DENSITY COMPLIANT PIN CONNECTOR

BACKGROUND OF THE INVENTION

1. Technical Field of the Invention

The present invention relates to telecommunications equipment and components and, more particularly, to a system and method for providing the capability to withstand high voltages between pins of a high-density compliant pin connector used in network equipment.

2. Description of Related Art

A common requirement of telecommunications equipment is resistance to foreign voltages such as lightning and power-cross, particularly when the equipment has connections to outside plant cables. With the use of high-density press-fit compliant pin connectors such as 2 mm Hard Metric or Futurebus styles, it is difficult to achieve sufficient space between pins and connector pads to prevent arcing and/or failure under severe lightning conditions.

Two solutions exist for increasing the high voltage resistance capability between pins and connector pads to prevent arcing. In one technique, the printed circuit board (PCB) or backplane that receives a high-density compliant pin connector is provided with a complete conformal coating to prevent arcing. While effective, the conformal coating method is beset with several deficiencies and drawbacks. First, conformal coating is expensive, thereby adding to the component's cost of manufacture. Also, reworking conformally coated components is inefficient because the coating is difficult to remove once applied. Consequently, manufacturability of conformally coated components is negatively impacted. Moreover, most customers do not accept conformally coated products.

With respect to the other solution for reducing inter-pin or inter-pad arcing, one or several pins interspersed between high voltage pins of a high-density compliant pin connector are left unconnected so as to increase the physical distance, and thereby the electrical path, between the high voltage pins. Although this technique is known to diminish the risk of inter-pin arcing, those skilled in the art should readily appreciate that several disadvantages remain in the practice of the solution. First, leaving unconnected pins in a connector to give physical separation wastes pins (which adversely affects the pin budget in an application) and can greatly increase connector size and cost. Furthermore, the option of leaving unconnected pins may not be available in existing connector designs where changes to connector pin usage are not permitted because of, for example, the requirement of backward compatibility with the PCB/backplane receptacles.

SUMMARY OF THE INVENTION

Accordingly, the present invention is directed to a system and method for providing high voltage resistance capability in a receptacle for accepting a high-density compliant pin connector wherein inter-pin arcing is advantageously reduced. A plurality of high-density compliant pin through-holes are formed in a printed circuit board (PCB) for receiving the pins of the high-density compliant pin connector. The through-holes are plated using an electrically conductive material, whereby conductive pads are formed around the plated through-holes on at least one side of the PCB. Thereafter, the conductive pads around the plated through-holes on the PCB are removed by controlled depth back-drilling. Accordingly, the receptacle's PCB is provided with a plurality of back-drilled portions around the through-holes formed therein so as to increase the inter-pad clearance of the through-holes for withstanding foreign voltages.

In a presently preferred exemplary embodiment, the through-hole plating is comprised of two metallic layers: an inner copper (Cu) layer and an outer tin/tin-lead (Sn/SnPb) layer. The inner copper layer is provided with a plurality of internal pad structures interior to the PCB. Where external conductive pads comprised of metals or metallic compounds are formed on both sides of the PCB, the technique of controlled depth back-drilling is preferably used to remove such metallic pads on each side of the PCB.

BRIEF DESCRIPTION OF THE DRAWINGS

A more complete understanding of the present invention may be had by reference to the following Detailed Description when taken in conjunction with the accompanying drawings wherein:

FIG. 3 depicts an exemplary embodiment of a high-density compliant pin connector receptacle provided in accordance with the teachings of the present invention.

DETAILED DESCRIPTION OF THE DRAWINGS

Figure 1A:
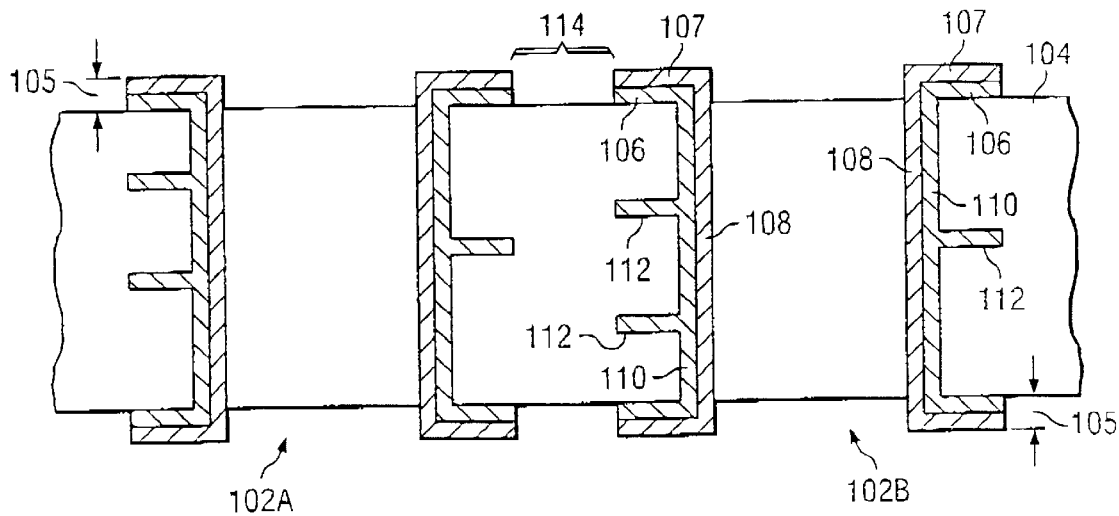
FIG. 1A is a cross-sectional view of a PCB with a plurality of high-density compliant pin through-holes before controlled depth back-drilling.

In the drawings, like or similar elements are designated with identical reference numerals throughout the several views thereof, and the various elements depicted are not necessarily drawn to scale. Referring now to FIG. 1A, depicted therein is a cross-sectional view of a PCB laminate 104 with a plurality of high-density compliant pin through-holes (e.g., through-holes 102A and 102B are shown) before controlled depth back-drilling. Those skilled in the art should recognize upon reference hereto that the PCB 104 is operable to form at least a portion of a high-density compliant pin receptacle apparatus (not shown in this FIG.) in accordance with the teachings of the present invention as will be described in greater detail hereinbelow.

The exemplary through-holes 102A and 102B are plated with an electrically conductive material which forms an external conductive pad 105 (also referred to as a "land") around the top of each through-hole on at least one side of the PCB 104. In a presently preferred exemplary embodiment of the present invention, the through-holes 102A and 102B are preferably plated with an inner copper plating layer 110 and an outer metallic compound layer 108 comprised of a compound such as, e.g., Sn/SnPb. Accordingly, each of the external pads comprises a copper pad portion 106 and a metallic compound portion 107.

The inner copper layer 110 is preferably provided with one or more internal pad structures, e.g., pad structures 112, which extend from the inner copper layer 110 and are disposed interior to the PCB 104. The outer (or, external) conductive pads 105 extend out on the upper and lower surfaces of the PCB 104 around the through-holes such that only a small inter-pad clearance 114 is obtained, which may not be substantially sufficient to withstand the high voltages.

Figure 1B:
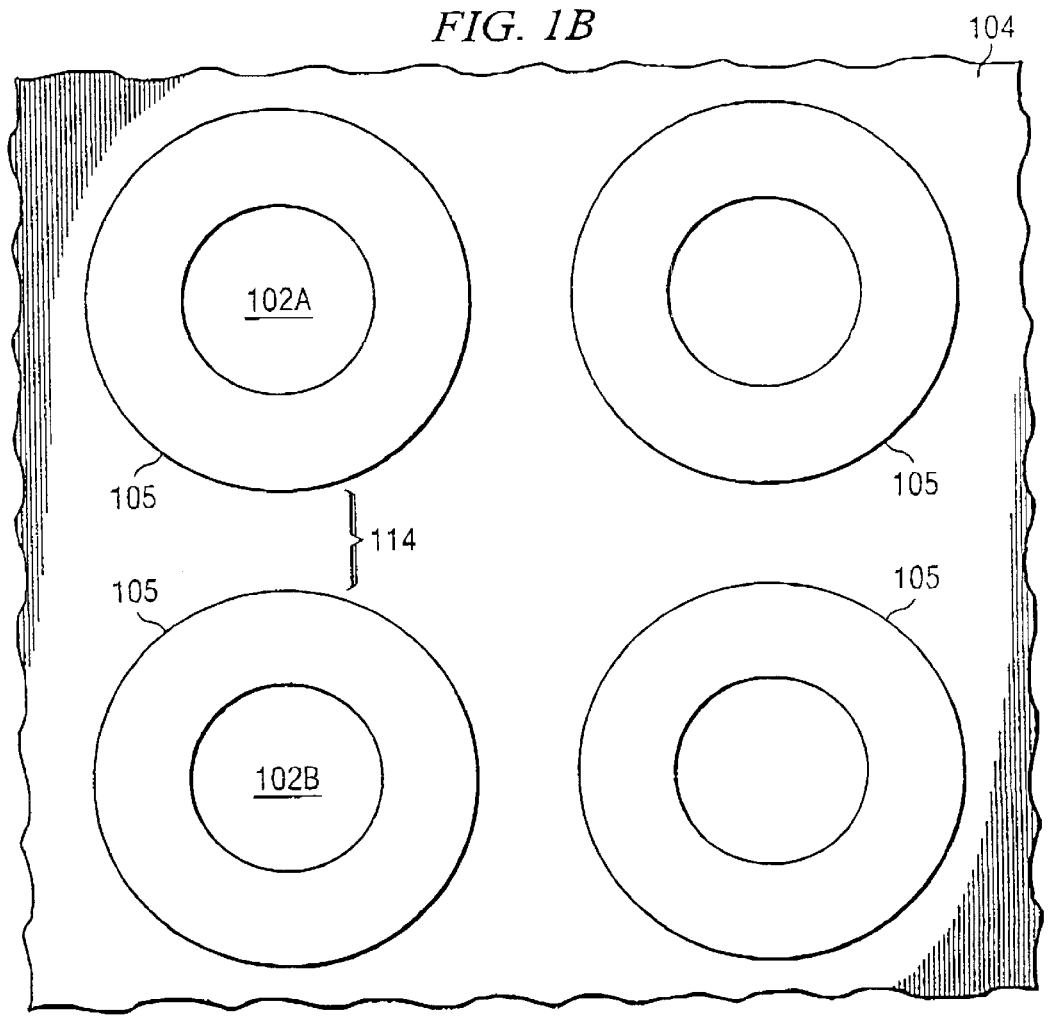
FIG. 1B is a top view of the PCB with the external conductive pads disposed thereon before controlled depth back-drilling.

FIG. 1B is a top view of the PCB 104 with the external conductive pads 105 disposed on one of the surfaces of the PCB laminate before controlled depth back-drilling. The small inter-pad clearance 114 between the through-holes 102A and 102B is also exemplified in this view.

Figure 2A:
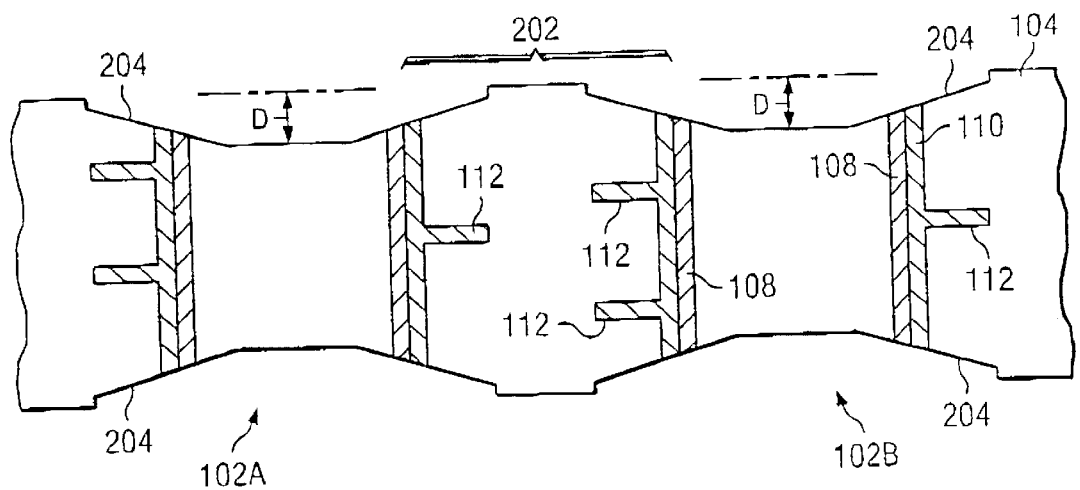
FIG. 2A is a cross-sectional view of the PCB after controlled depth back-drilling both sides of the PCB in an exemplary embodiment of the present invention.

Referring now to FIG. 2A, depicted therein is a cross-sectional view of the PCB 104 after back-drilling both sides of the PCB in an exemplary embodiment of the present invention to a controlled depth "D". Accordingly, by employing the back-drill via technique around each through-hole, a back-drilled portion (e.g., reference numeral 204) is formed around each through-hole disposed on at least one side of the PCB laminate. As a result, the outer conductive pads are removed and, consequently, an increased inter-pad clearance 202 is advantageously obtained thereby. Those skilled in the art should appreciate that the increased inter-pad clearance reduces the susceptibility to inter-pin arcing due to foreign voltages when a high-density compliant pin connector is positioned in a receptacle having the PCB 104 with the back-drilled portions formed thereon.

Figure 2B:
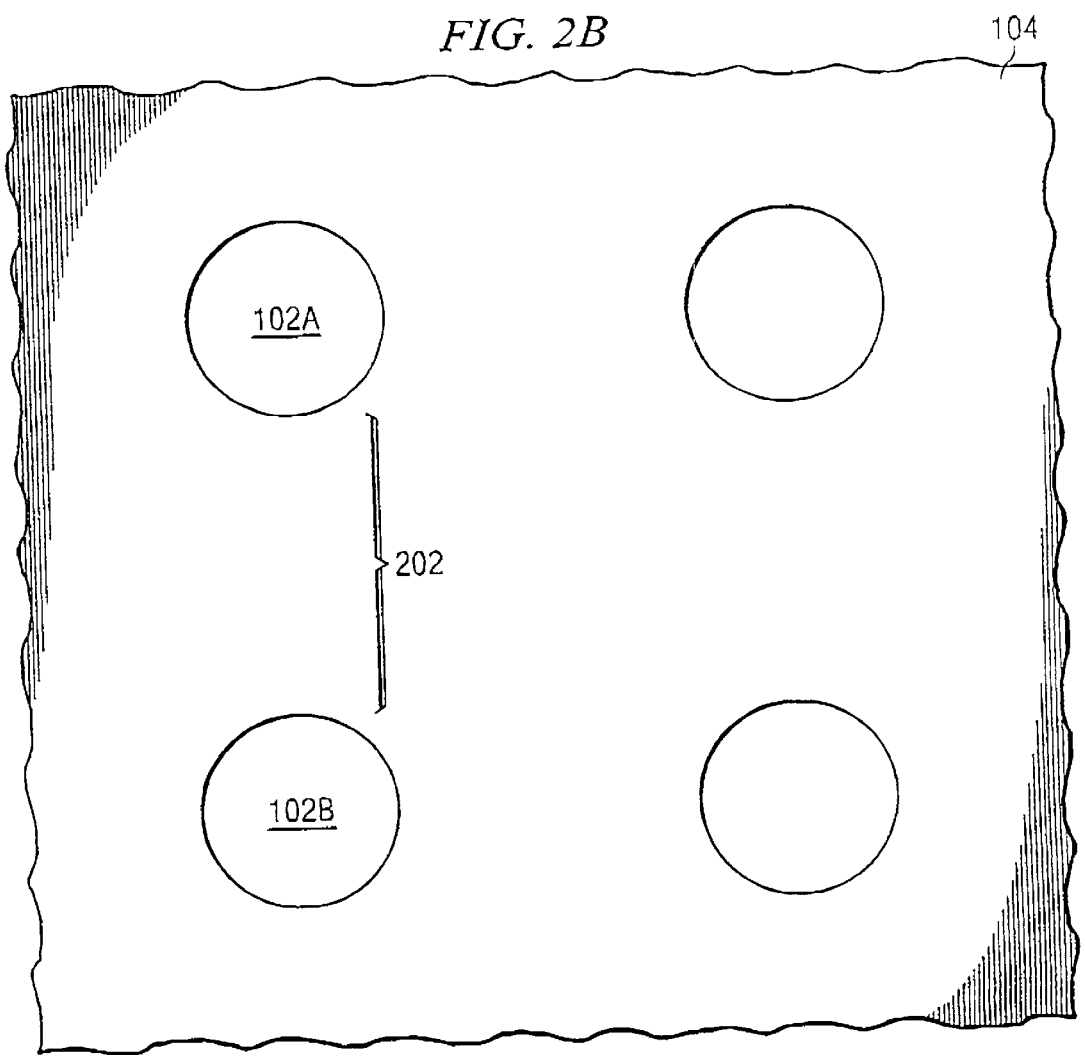
FIG. 2B is a top view of the PCB after removing the external conductive pads in accordance with the teachings of the present invention.

FIG. 2B is a top view of the PCB 104 depicting one of the surfaces after removing the external conductive pads in accordance with the teachings of the present invention. The increased inter-pad clearance 202 between the exemplary through-holes 102A and 102B is particularly highlighted in this view.

Referring now to FIG. 3, depicted therein is an exemplary embodiment of a high-density compliant pin connector receptacle apparatus 300 provided in accordance with the teachings of the present invention. A high-density compliant pin connector housing 304 having a plurality of pins is shown wherein pins 302A and 302B are particularly exemplified. The PCB 104 having the back-drilled portions 204 for removing the external pads as described hereinabove is provided as at least a portion of the high-density compliant pin connector receptacle apparatus 300. The increased inter-pad clearance 202 between the exemplary through-holes 102A and 102B increases the electrical path's distance between the pins for reducing susceptibility to inter-pin arcing.

In a presently preferred exemplary embodiment of the present invention, the high-density compliant pin connector housing 304 houses pins such as, for example, a plurality of 2 mm Hard Metric pins or Futurebus style pins.

It should be appreciated that controlled depth drilling used in accordance herewith removes the outer PCB pads of a compliant pin connector hole, thereby creating a greater electrical distance between conductors of the adjacent through-holes and connectors. A greater physical separation between the adjacent pads, hence higher resistance to arcing under voltage stress, e.g., lightning, is accordingly effectuated.

Based on the foregoing, those skilled in the art should recognize that the present invention's system and method of reducing inter-pin arcing in high-density compliant pin connectors offers several advantages. First, in practicing the present invention in accordance with the teachings contained herein, no expensive equipment or manufacturing processes are necessary or need to be developed as existing back-drill equipment already in place at PCB vendor facilities can be effectively leveraged for purposes of the present invention.

Also, the present invention advantageously overcomes the deficiencies of the state of the art solutions for reducing susceptibility to inter-pin arcing. Accordingly, the need to apply conformal coatings to the connector components is obviated thereby. Further, since back-drilling can increase the withstand voltage capability without changes to the connector or its pin arrangement, backward pin compatibility is not compromised.

It is believed that the operation and construction of the present invention will be apparent from the foregoing Detailed Description. While the apparatus and method shown and described have been characterized as being preferred, it should be readily understood that various changes, modifications and enhancements could be made therein without departing from the scope of the present invention as set forth in the following claims. For example, it is possible to use different metals and/or metallic combinations as the conductive plating materials for plating the through-holes formed in the PCB substrates. Further, the teachings of the present invention can also be practiced in conjunction with the existing solutions such as conformal coating methods or unconnected pins. Whereas it may be preferred in certain embodiments that the depth to which the back-drilling removes the PCB substrate material (and the outer pads) be the same for all through-holes, such a limitation is not necessary for practicing the present invention. For example, the back-drilled portions may comprise variable depths around the through-holes in some applications, thereby removing varying amounts of the PCB laminations and the outer pad material. In some instances, the back-drilling may be deep enough on one side of the PCB so as to remove the outer pads as well as a portion of the inner plating. Additionally, although the motivation for the present invention has been set forth in the context of telecommunications network equipment, it should be appreciated that the teachings hereof may be practiced in any equipment. Accordingly, those skilled in the art should readily appreciate that these and other variations, additions, modifications, enhancements, et cetera, are deemed to be within the ambit of the present invention whose scope is determined solely by the following claims.

What is claimed is:

1. A method of reducing susceptibility to inter-pin arcing in a high-density compliant pin connector, comprising the steps of:

fabricating high-density compliant pin through-holes in a printed circuit board for receiving said high-density compliant pin connector;

plating said through-holes using an electrically conductive material, said electrically conductive material forming conductive pads around said plated through-holes on at least one side of said printed circuit board; and backdrilling at least a portion of said conductive pads around said plated through-holes on said at least one side of said printed circuit board so as to increase inter-pad clearance of said through-holes.

2. The method of reducing susceptibility to inter-pin arcing in a high-density compliant pin connector as set forth in claim 1, wherein said electrically conductive material comprises metallic plating material and said conductive pads are comprised of metallic pads.

3. The method of reducing susceptibility to inter-pin arcing in a high-density compliant pin connector as set forth in claim 2, wherein said removing step is effectuated by back-drill via technology.

4. The method of reducing susceptibility to inter-pin arcing in a high-density compliant pin connector as set forth in claim 2, wherein said removing step is effectuated by controlled depth drilling of said at least one side of said printed circuit board around said plated through-holes by a predetermined depth.

5. The method of reducing susceptibility to inter-pin arcing in a high-density compliant pin connector as set forth in claim 4, wherein said predetermined depth is the same for each of said plated through-holes.

6. The method of reducing susceptibility to inter-pin arcing in a high-density compliant pin connector as set forth in claim 2, wherein said metallic plating material forms metallic pads around said plated through-holes on both sides of said printed circuit board, and further wherein said removing step is effectuated on both sides of said printed circuit board around said plated through-holes.

7. The method of reducing susceptibility to inter-pin arcing in a high-density compliant pin connector as set forth in claim 6, wherein said plating step comprises deposing a copper plating layer.

8. The method of reducing susceptibility to inter-pin arcing in a high-density compliant pin connector as set forth in claim 7, wherein said plating step further comprises depositing a metallic compound plating layer on said copper plating layer.

9. The method of reducing susceptibility to inter-pin arcing in a high-density compliant pin connector as set forth in claim 8, wherein said metallic compound plating layer comprises at least one of lead and tin.

10. The method of reducing susceptibility to inter-pin arcing in a high-density compliant pin connector as set forth in claim 9, wherein said high-density compliant pin connector comprises a plurality of 2 mm Hard Metric pins corresponding to said through-holes.

11. The method of reducing susceptibility to inter-pin arcing in a high-density compliant pin connector as set forth in claim 9, wherein said high-density compliant pin connector comprises a plurality of Futurebus style pins corresponding to said through-holes.

12. A high-voltage resistant receptacle apparatus for accepting a high-density compliant pin connector, comprising:
   a printed circuit board having a plurality of through-holes corresponding to the number of pins disposed in said high-density compliant pin connector;
   at least one layer of conductive plated material deposited in said through-holes; and
   a back-drilled portion formed on said printed circuit board, wherein said back-drilled portion effectuates removal of conductive pad material formed around said through-holes on at least one side of said printed circuit board so as to increase inter-pad clearance between said through-holes.

13. The high-voltage resistant receptacle apparatus for accepting a high-density compliant pin connector as set forth in claim 12, wherein said conductive plated material comprises copper.

14. The high-voltage resistant receptacle apparatus for accepting a high-density compliant pin connector as set forth in claim 12, wherein said conductive plated material comprises a metallic compound of lead and tin.

15. The high-voltage resistant receptacle apparatus for accepting a high-density compliant pin connector as set forth in claim 12, wherein said high-density compliant pin connector comprises a plurality of Futurebus style pins corresponding to said through-holes.

16. The high-voltage resistant receptacle apparatus for accepting a high-density compliant pin connector as set forth in claim 12, wherein said high-density compliant pin connector comprises a plurality of 2 mm Hard Metric pins corresponding to said through-holes.

17. A method of increasing resistance to foreign voltages in high-density compliant pin connectors, comprising:
   forming a plurality of high-density compliant pin through-holes in a printed circuit board corresponding to the number of pins disposed in a high-density compliant pin connector;
   plating said through-holes using a metallic plating material, said plating material forming metallic pads exposed on both sides of said printed circuit board around each of said plated through-holes; and
   back-drilling said printed circuit board on both sides to remove said metallic pads formed around said through-holes so as to increase inter-pad clearance between said through-holes.

18. The method of increasing resistance to foreign voltages in high-density compliant pin connectors as set forth in claim 17, wherein said metallic plating material comprises copper.

19. The method of increasing resistance to foreign voltages in high-density compliant pin connectors as set forth in claim 17, wherein said metallic plating material comprises a metallic compound of lead and tin.

20. The method of increasing resistance to foreign voltages in high-density compliant pin connectors as set forth in claim 17, wherein said high-density compliant pin connector comprises a plurality of Futurebus style pins corresponding to said through-holes.

21. The method of increasing resistance to foreign voltages in high-density compliant pin connectors as set forth in claim 17, wherein said high-density compliant pin connector comprises a plurality of 2 mm Hard Metric pins corresponding to said through-holes.

* * * * *